United States Patent [19]
Arnold et al.

[11] Patent Number: 5,113,236
[45] Date of Patent: May 12, 1992

[54] INTEGRATED CIRCUIT DEVICE PARTICULARLY ADAPTED FOR HIGH VOLTAGE APPLICATIONS

[75] Inventors: Emil Arnold, Chappaqua; Steven L. Merchant, Yorktown Hgts.; Peter W. Shackle, Somers, all of N.Y.

[73] Assignee: North American Philips Corporation, New York, N.Y.

[21] Appl. No.: 628,307

[22] Filed: Dec. 14, 1990

[51] Int. Cl.⁵ .................................... H01L 27/02
[52] U.S. Cl. .......................... 357/41; 357/42; 357/23.4; 357/68; 357/71
[58] Field of Search ............. 357/42, 23.4, 68, 71, 357/41, 23

[56] References Cited

U.S. PATENT DOCUMENTS

| | | | |
|---|---|---|---|
| 4,883,543 | 11/1989 | Grossen, Jr. et al. | 357/41 |
| 4,884,116 | 11/1989 | Shirai | 357/41 |
| 4,893,159 | 1/1990 | Suzuki et al. | 357/41 |
| 4,962,413 | 10/1990 | Yamazaki eet al. | 357/41 |

FOREIGN PATENT DOCUMENTS

01-238066 9/1989 Japan .

OTHER PUBLICATIONS

Ratnam "Novel Silicon-on-Insulator Mosfet for High--Voltage Integrated Circuits" *Electronics Letters* vol. 25 No. 8, Apr. 13, 1989 pp. 536-537.

Nakashima et al "High-Voltage CMOS SIMOX Technology and its Application to a BSH-LSI" *IEEE Transactions on Electron Devices* vol ED 33 No. 1 Jan. 1986 pp. 126-132.

Rumennik "Power Devices are in the Chips" *IEEE Spectrum*, vol. 22, Jul. 1985 pp. 27, 29, 31, and 33.

*Primary Examiner*—Andrew J. James
*Assistant Examiner*—Daniel N. Russell

[57] ABSTRACT

A silicon on insulator of integrated circuit comprising a plurality of components typically adopted for high voltage application having a semiconductor substrate of a first conductivity type, an insulating layer provided on the substrate, a semiconductor layer provided on the insulating layer, a number of laterally separated circuit elements forming parts of a number of subcircuits provided in the semiconductor layer, a diffusion layer of a second conductivity type opposite to that of the first conductivity type provided in the substrate and laterally separated from all the other circuit elements and means for holding the diffusion layer at a voltage at least equal to that of the highest potential of any of the subcircuits present in the integrated device.

14 Claims, 5 Drawing Sheets

INTEGRATED CIRCUIT DEVICE PARTICULARLY ADAPTED FOR HIGH VOLTAGE APPLICATIONS

BACKGROUND OF THE INVENTION

The instant invention relates to integrated circuit devices which are particularly adapted for high voltage applications. The invention particularly relates to integrated circuit devices which are manufactured by the use of semiconductor-on-insulator (SOI) technology and which devices exhibit improved voltage breakdown properties.

A major problem in high voltage integrated circuit technology is to find a satisfactory solution for the problem of isolation of components and subcircuit sections.

The usual method of electrically isolating components within an integrated circuit and, more particularly, within a power integrated circuit (PIC) or a high voltage integrated circuit (HVIC) is by what is called "junction isolation". In such a method p-type diffusions may be used to isolate various devices formed in a n-type epitaxial layer on top of a silicon substrate. Such a method is described in Rumennik, IEEE Spectrum, Vol. 22, pp. 42–48, July 1985.

Another method of electrical isolation of such components is the so-called "dielectric isolation". In this method, an electrically-insulating material, such as silicon dioxide is used to isolate the individual components such as devices operating at very different electrical potentials. SOI technology when the semiconductor is silicon and the insulator is silicon dioxide (hereinafter referred to as "oxide") is an example of a dielectric isolation method. In this technology the devices are built in a layer of silicon, approximately 0.1–10 $\mu$m thick which is separated from the silicon substrate by a dielectric layer such as silicon oxide typically 0.1–5 $\mu$m thick.

Several methods are known for producing the SOI starting material. In one of these methods "SIMOX", silicon oxide is formed by ion implantation of oxygen ions into a silicon wafer.

In another method, zone-melt-recrystallized (ZMR) material is prepared by depositing a polycrystalline silicon layer over an oxide-coated silicon wafer and converting the polycrystalline silicon into a monocrystalline silicon film by irradiating the polycrystalline silicon with a power source such as a laser or a graphite-strip heater.

Another method is the bonding and etchback or direct bonding method in which two oxide-coated silicon wafers are joined together to form a strong bond and one of these wafers is thinned to the desired thickness.

Several methods have been proposed for improving the breakdown voltage of devices formed in the SOI material.

An offset-gate SOI MOS transistor is described in C.I. Drowley et al (Mat. Res. Symp. Proc., Vol. 33, p. 133, 1984). This article indicates that with the structure shown a breakdown voltage of 38V is achieved.

A method of increasing the breakdown voltage that applies specifically to SIMOX devices is shown in S. Nakashima, (Trans. Electron Dev. ED-33, p. 126, 1936, By this technique, only a moderately high breakdown voltage is achieved, generally of about 180V.

Kawai, Japanese Application, 63-63640 shows a structure containing a buried n-type diffusion region in a silicon substrate under a drain of an offset-gate SOI-MOS transistor. Kawai shows that the buried diffusion region extends under the drain and that a contact window is provided through the insulating layer so as to enable positive potential to be conducted directly to the diffusion region.

The Kawai application teaches that by providing a positive potential to the n-type diffusion region, the potential difference between the drain region and the silicon substrate can be decreased thereby allowing the drain breakdown voltage to be increased.

A somewhat similar structure to that shown in the Kawai application is that shown by Ratnam, Electronics Letters, Vol. 25, p. 538, 1989. As shown therein, a diffusion region is provided in the silicon substrate directly under the drain of a MOS transistor where, however, a single voltage is applied to the drain and to the diffusion region.

Here a considerable improvement in breakdown voltage is achieved.

While satisfactory improvements in voltage breakdown properties are achieved by the structures shown in the Kawai application and in the Ratnam article, this art appears to indicate that in order to improve the voltage breakdown properties of components present in an SOI integrated circuit, it is necessary that for each component present a separate diffused region must be provided in the silicon substrate and this diffused region be present in the silicon substrate directly under the component. As a result, according to this art, in order to improve the voltage breakdown property of an integrated circuit comprising a large number of components it was thought necessary to provide a separate diffusion region for each component. This is commercially unsatisfactory in that provision of a large number of diffusion regions adds significantly to the cost of manufacture of such integrated circuits.

An additional problem in having a diffusion region for each component present in an integrated circuit is that the bias contacts of the diffusion regions are close to the components and each diffusion region is at about the potential of an element of the neighboring component. If the substrate is of sufficiently high resistivity the depletion regions produced will readily punch through uniting the depletion regions and thereby joining together all of the components.

Thus this prior art method is not suitable for use in complex integrated circuits with a large number of components intended to operate at different electric potentials or for source-follower devices.

SUMMARY OF THE INVENTION

A principal object of this invention is to provide a SOI integrated circuit comprising a plurality of components which is particularly adapted for high voltage application and particularly exhibits improved voltage breakdown characteristic. Another object of this invention is to provide such an improved integrated circuit in which the cost of production is significantly reduced.

These and other objects to the invention will be apparent from the description that follows:

The Applicants have determined that when the resistivity of the semiconductor substrate is sufficiently high (greater that approximately 100 ohm-cm), and the potential applied to a diffusion area of a second conductivity type in the substrate is at least as high as that applied to any component in the integrated circuit, the resultant depletion region extends along the substrate in a lateral direction to a distance exceeding 100 micrometers. As a result the Applicants have found that a single diffusion region will act to provide protection against voltage breakdown for more than one circuit component over a lateral distance exceeding 100 micrometers.

Therefore, the invention comprises a SOI integrated circuit device comprising a semiconductor substrate of a first conductivity type and having a resistivity of greater than about 100 ohm-cm, an insulating layer of a second conductivity type opposite to said first conductivity type provided on the substrate, a semiconductor layer provided on the insulating layer, a plurality of circuit elements forming parts of a plurality of subcircuits provided in the semiconductor layer, a diffusion area of a second conductivity type, opposite to the insulating layer of a first conductivity type, provided in the substrate and positioned so as to be laterally separated from other circuit components and a means for holding the diffusion area at a voltage at least equal to that of the highest potential of any subcircuit in the integrated circuit device.

The invention also comprises novel semiconductor-on-insulator circuit structures which exhibit improved voltage breakdown characteristics and are particularly adapted for high voltage applications. According to this aspect of the invention, such improved structures comprise a semiconductor substrate of a first conductivity type of a resistivity greater than about 100 ohms-cm, an insulating layer provided on the substrate, a semiconducting layer of second conductivity type provided on the insulating substrate, a diffusion area provided in the substrate which diffusion area is laterally separated from other components of the circuit and is held at a voltage at least equal to the highest potential of the source or drain portions, metal bus lines constituting high-voltage interconnections, and isolated devices or subcircuit regions capable of operating in a source-follower mode.

DETAILED DESCRIPTION OF THE INVENTION

The Applicants have found that a single diffusion area will act to provide protection against voltage breakdown for more than one circuit component over a lateral distance exceeding 100 micrometers.

For a large integrated circuit, several such diffusion regions may be provided. These are placed in the parts of the chip where there are high voltage components and spaced within a few hundred micrometers away from the high voltage components. Alternatively, metal interconnections may be provided, as described below which help the lateral spreading of the depletion region, in the substrate to encompass the entire extent of the integrated circuit.

Preferably, the substrate is a silicon substrate, usually of a high resistivity p-type silicon 100 ohm-cm resistivity or greater.

In a further preferred aspect of the invention, the insulating layer is a silicon oxide layer. When the substrate is a p-type silicon substrate and the insulating layer is a silicon oxide layer the positive interfacial charge usually present at the silicon-silicon oxide interface aids in the spreading of the depletion region over large distances that sometimes exceed 1 cm.

When the substrate is a p-type silicon substrate the diffused area is an n-type diffusion area. However the invention is also applicable to an n-type silicon substrate provided with a p-type diffusion area.

When the silicon substrate is a p-type silicon substrate and the insulating layer is silicon oxide the semiconductor layer is preferably a substantially n-type monocrystalline silicon layer.

The invention is particularly useful for integrated circuits adapted for high voltage applications. In particular the invention has been found to be useful for circuit structures which contain devices or subcircuit regions capable of operating in a source-follower mode. According to this aspect of the invention these improved structures comprise a semiconductor substrate of a first conductivity type and an insulating layer provided on the substrate, a semiconducting layer of a second conductivity type provided on the insulating layer, a diffusion layer of a second conductivity type opposite to the first conductivity type provided in the substrate which diffusion area is laterally separated from other components of the circuit and is held at a voltage at least equal to the highest potential of source and drain portions. These source and drain portions are parts of isolated devices or subcircuit regions capable of operating in a source-follower mode and high voltage interconnections preferably provided by metal bus lines.

Preferably this diffusion area is positioned so that it has no overlying non contacting circuit elements. Additionally it is preferred that the diffusion area be held at a voltage that is higher than the highest potential of any subcircuit in the device.

DESCRIPTION OF THE PREFERRED EMBODIMENTS

Figure 1:
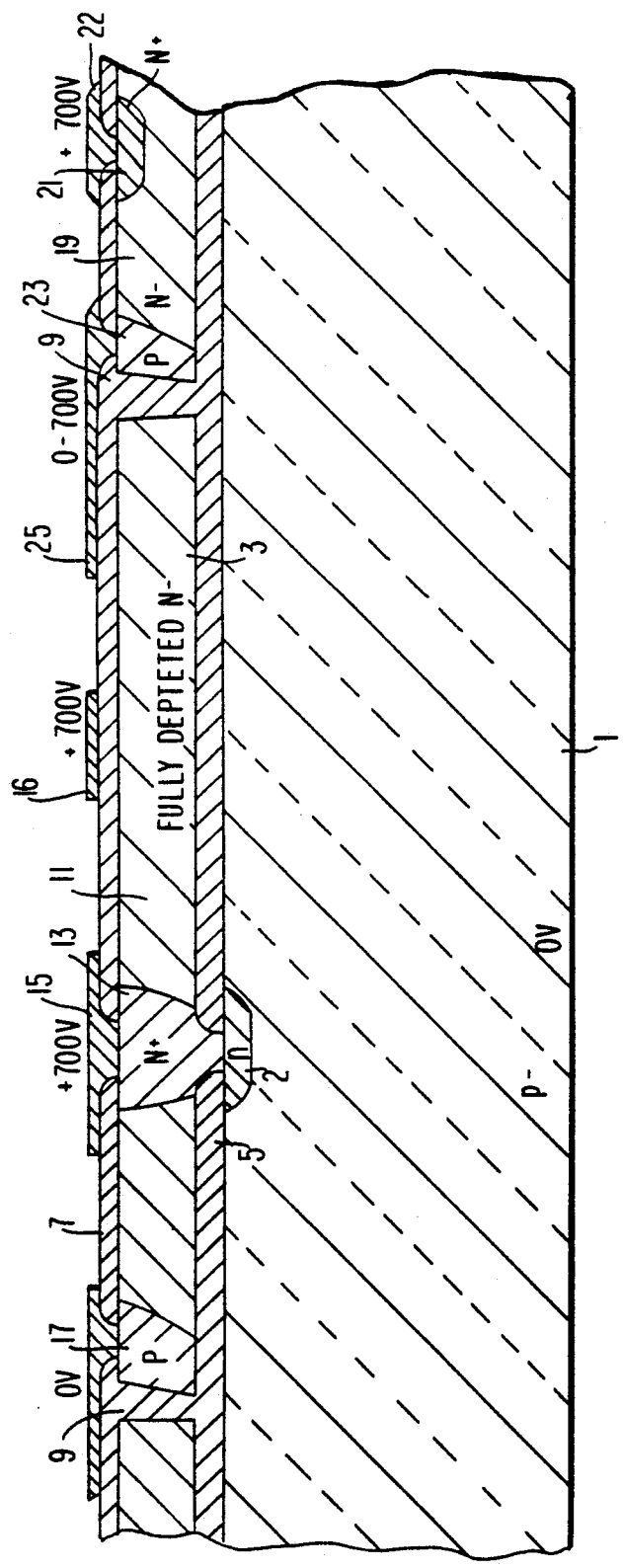
FIG. 1 is a cross-sectional view of a portion of a high-voltage silicon-on-insulator integrated circuit including a diffused contact region in the substrate, a high voltage interconnect bus and a source-follower device.

The basic function of the present invention is illustrated in FIG. 1. Although a high-voltage diode is shown in this illustration, the same principle can be applied to other high-voltage devices.

A substrate 1 is made of high-resistivity p-type silicon (100 ohm-cm resistivity or greater). An n-type diffusion region 2 is formed in the substrate 1, as described in detail below. The portion of the integrated circuit in SOI layer 3, provided between oxide layers 5 and 7 in contact with the n-type diffusion region 2, is isolated from the remainder of the integrated circuit by oxide trenches 9 to form an n-type island 11 which is biased to the most positive potential in the entire circuit (700V) through N+contact 13 and metal bus 15, while the substrate 1 is at ground potential. The depletion region spreads out from the n-type diffusion region 2 through the p-type substrate 1 and under the oxide layer 5 beneath other portions of the integrated circuit.

The ability to achieve interconnects between high-voltage components in the circuit is illustrated by the regions 11 and 16 in FIG. 1. Inside the n-type island 11 there exists around the edge a p-type region 17 which is held at a ground potential (0V). Since the n-type diffusion region 2 is held at 700V, the entire n-type island 11 becomes depleted, as is the p-type substrate 1 under the island. Thus it is possible to route a metal bus 16 at high voltage (700V) from one part of the circuit to another.

The so-called source-follower operation of a device, wherein the device or a sub-section of the circuit may exist at any potential below that of the diffused n-type region is illustrated by the region 19 in FIG. 1. The n-type contact 21 and metal bus 22 represent the portion of this region that exists at a high (700-V) potential, and the p-type contact 23 represents the portion that can exist at either high or low potential (0-700V) A metal "field plate" 25 extending from region 19 over a portion of the adjacent island 3 helps the depletion region to spread through island 11 and region 19 thus preventing breakdown when region 19 is at a high potential.

Figure 2:
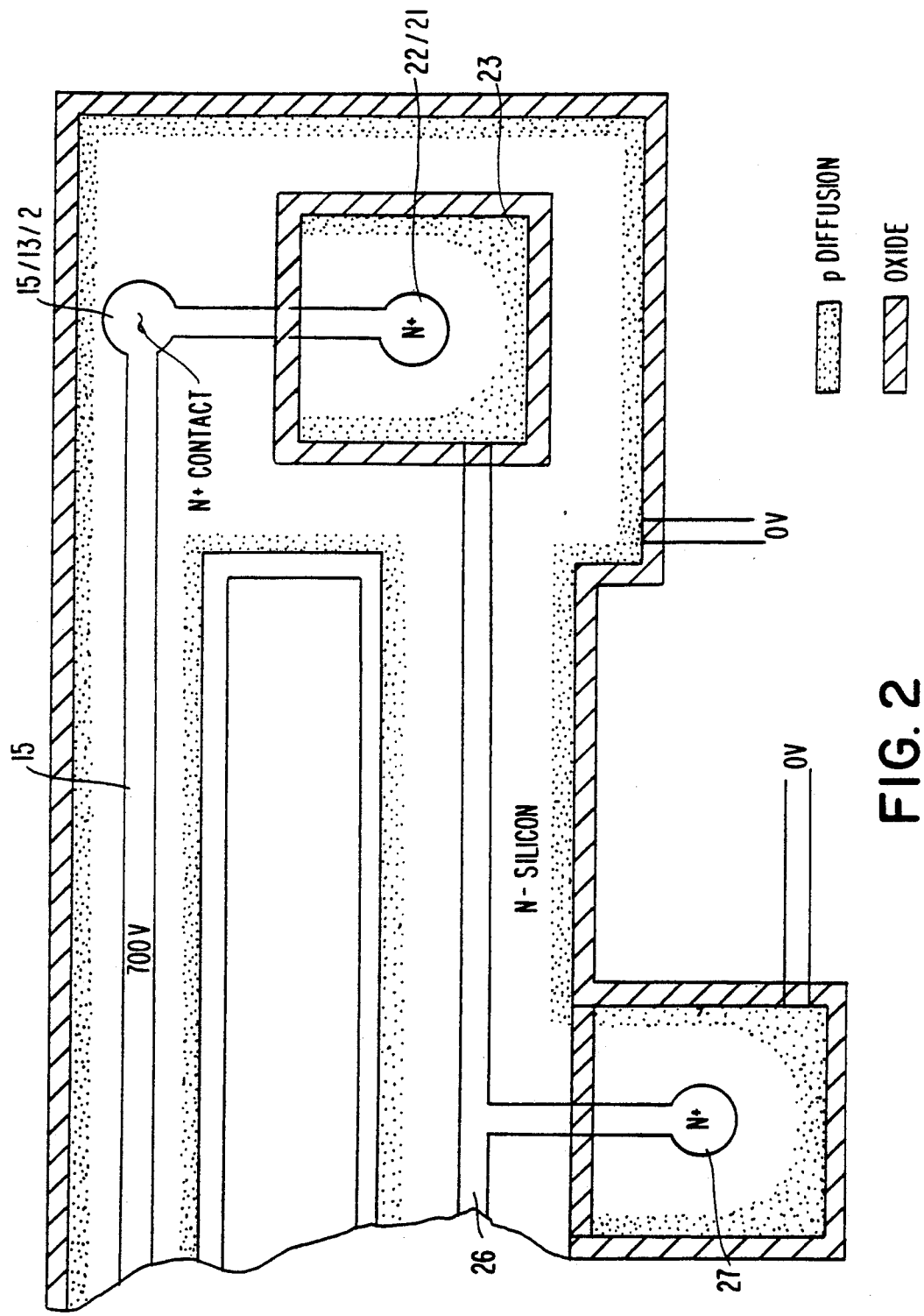
FIG. 2 is a plan view of a portion of silicon-on-insulator circuit including a high-voltage diode, a diode operating in a source-follower mode, and a high-voltage interconnect bus

FIG. 2 shows a plan view of a portion of a circuit to illustrate how the high voltage interconnect is routed. In this example two series-connected diodes are used for simplicity; in the actual circuit other types of devices, such as transistors could be used. A 700 V bus line 15 makes a contact (as shown in cross-section in FIG. 1) through the n+ region 13 to the diffused n-type region 2 in the substrate and connects through the metal pad 22 to the n-type contact 21 in the first diode which is operated in a "source-follower" mode. The peripheral p-type region 23 is provided on the periphery of the source-follower diode, but is omitted on the side where the high-voltage bus 15 enters. The p-type region 23 is connected by another metal bus 26 to an n-type contact 27 on the second diode, which can exist at either low or high potential.

Figure 3:
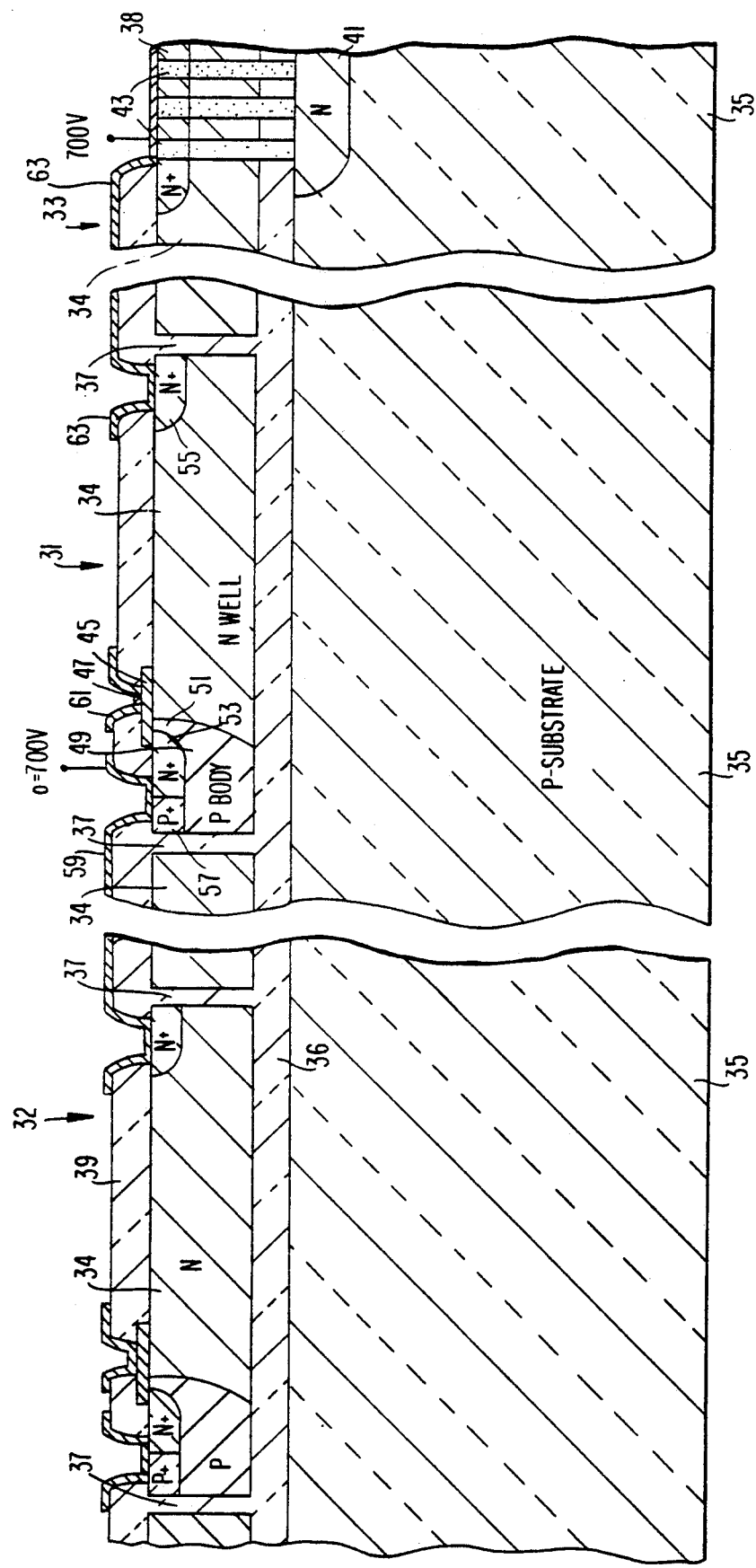
FIG. 3 is a cross-sectional view illustrating the structure of a bridge circuit comprising two lateral-double-diffused metal-oxide-semiconductor-silicon-on insulator (LDMOS-SOI) transistors in a source-follower circuit.

FIG. 3 shows an embodiment of the invention having a so-called "bridge structure", wherein one component operates at a high potential and the other at either high or low potential. In FIG. 3 there is shown part of an integrated circuit having a source-follower bridge circuit comprising two lateral-double-diffused-metal-oxide-semiconductor silicon-on-insulator (LDMOS-SOI) transistors.

In FIG. 3, region 31 represents a transistor operating in source-follower mode, region 32 represents a transistor operating in grounded-source configuration, and region 33 contains the diffusion area in the substrate which is connected to the highest voltage in the circuit (700 V in the present example).

The fabrication sequence of the structure in FIG. 3 is as follows.

The starting SOI layer 34, obtained by any of the standard techniques described above, such as, for example, zone-melting recrystallization or direct bonding is formed on substrate 35. The substrate is preferably p-type silicon of 100 ohm-cm or greater resistivity, the thickness of the buried oxide insulator 36 is preferably 0.5-5 micrometers, and the top SOI layer 34 is preferably 0.5-10 micrometers thick n-type silicon of 10 ohm-cm or greater resistivity.

The SOI layer 34 is implanted with phosphorus ions (through a standard 600 angstrom screen oxide) to obtain the proper resistivity required for optimum breakdown voltage, as set out in the teaching of Appels and Vaes (IEDM Proc. 1979, p. 238). In this case, an implantation dose of $0.5-2\times10^{12}/cm^2$ at 50 KeV, followed by diffusion at 1150° C. for approximately 6 hours is employed.

Trench isolation regions 37 are formed as follows. A 3000 angstrom silicon nitride layer (not shown) is deposited, by standard chemical vapor deposition, over a standard 600 angstrom pad oxide (not shown) on the surface of the SOI layer 34. Then a 7000 angstrom silicon dioxide layer (not shown) is deposited, by standard chemical vapor deposition, on the layer of silicon nitride. A photoresist mask layer (not shown) is used to selectively expose those regions where trenches are desired. The silicon dioxide, silicon nitride, and pad oxide layers are, respectively, removed (in the unmasked areas) by reactive ion etching. After removal of the photoresist mask, the full thickness of the SOI layer 34 is etched (also by reactive ion etching), employing the deposited silicon dioxide layer as a mask. This leaves 1-2 $\mu$m-wide trenches throughout the SOI layer. 1-2 $\mu$m of silicon dioxide is then deposited at a temperature of approximately 1000° C., to fill the trenches. A planarization etch of the silicon dioxide and silicon nitride layers completes this step.

The buried diffusion region 41 is formed as follows. Layers (not shown) of silicon nitride (1400 angstroms), polysilicon (3500 angstroms), and silicon dioxide (7000 angstroms), respectively, are deposited by standard chemical vapor deposition. Areas for trenches through which the buried diffusion will be formed are defined in a photoresist mask layer (not shown). Layers of silicon dioxide, polysilicon, and silicon nitride, respectively, are removed by reactive ion etching. The photoresist layer is then stripped and the SO layer 34 and buried silicon dioxide layer 36 are removed by reactive ion etching, employing the top silicon dioxide layer g as a mask, thereby forming trenches. A 600 angstrom screen oxide is grown at the trench bottoms and walls. Phosphorus is then implanted in a dose of $4\times10^{15}/cm^2$ at 100 KeV. This forms a separate buried N layer for each trench. A continuous buried N layer 41 will form later when the P body region 49 is diffused. The screen oxide at the bottom and sides of the trenches is removed, followed by the deposition of 2 $\mu$m of polysilicon, in-situ doped to a sheet resistance of 30 $\Omega$/sq., to form a N+ contact 43 to the buried N layer 41. A planarization etch of the polysilicon and silicon nitride layers completes this step.

The polysilicon gate 45 is formed as follows. The pad oxide used in the previous step is stripped and a 600 angstrom gate oxide 47 is grown. 5000 angstroms of polysilicon is deposited and the gate region is masked with a photoresist (not shown). The unmasked polysilicon regions are then removed by reactive ion etching. The photoresist is then removed.

The P body region 49 is formed as follows. Boron ions are implanted (dose $4.4\times10^{13}/cm^2$ and energy 80 KeV) in region 49, using a photoresist mask (not shown). The photoresist mask is such that the implantation is self-aligned to the polysilicon gate 45. After stripping the photoresist, the wafer is annealed at 1100° C. for approximately 20 hours. This drives the P body region 49 to a depth of approximately 5 $\mu$m (i.e. the SOI layer 34 thickness). The diffusion also spreads about 3.5 $\mu$m laterally, forming the channel region 51. In addition the multiple buried N layers diffuse to form a single continuous N buried layer 41.

An N+ source 53 and drain 55 are formed as follows. Arsenic ions are implanted (dose $7.5 \times 10^{15}/cm^2$ and energy 190 KeV) in the source 53, drain 55 regions, and atop the N buried layer 38 using a photoresist mask (not shown). After stripping the photoresist, the wafer is annealed at 950° C. for approximately 1 hour. This is done in such a way that 300 angstroms of silicon dioxide (not shown) grows on the polysilicon gate 45 to insulate it.

The P+ region 57 is formed by implanting Boron (dose $4.0 \times 10^{15}/cm^2$ and energy 40 KeV) in region 57, using a photoresist mask (not shown), and subsequently stripping the photoresist.

Aluminum contact 59 to source 53, aluminum contact 61 to gate 45, aluminum contact 63 to drain 55 and aluminum contact 63 to N+ contact 43 to the buried diffusion layer 41, are formed as follows. 1.3 $\mu$m of silicon dioxide (8% phosphorus) is deposited onto the wafer. This layer is then masked with photoresist, exposing only those regions where aluminum contacts are desired. The silicon dioxide is removed by reactive ion etching, and the photoresist is then stripped. The wafer is annealed at approximately 1000° C. for 30 minutes to smooth the etched silicon dioxide layer thus allowing better aluminum coverage. After etching any residual silicon dioxide from the contact areas, a 1.2 $\mu$m layer of aluminum (1% silicon, 25 $\Omega$sq.) is deposited. A photoresist mask is used to selectively expose regions in which the aluminum will be removed. The aluminum is then reactive ion etched to form separate contacts to source, gate, drain, etc., as shown. After stripping the photoresist, the wafer is alloyed at 407° C. for 30 minutes.

The final step involves the deposition of a 1.2 $\mu$m layer (not shown) of silicon dioxide (6% phosphorus) to protect the devices. Pad areas (not shown), used for making external electrical connections, are patterned with a photoresist mask and then opened by wet chemical etching.

Figure 4:
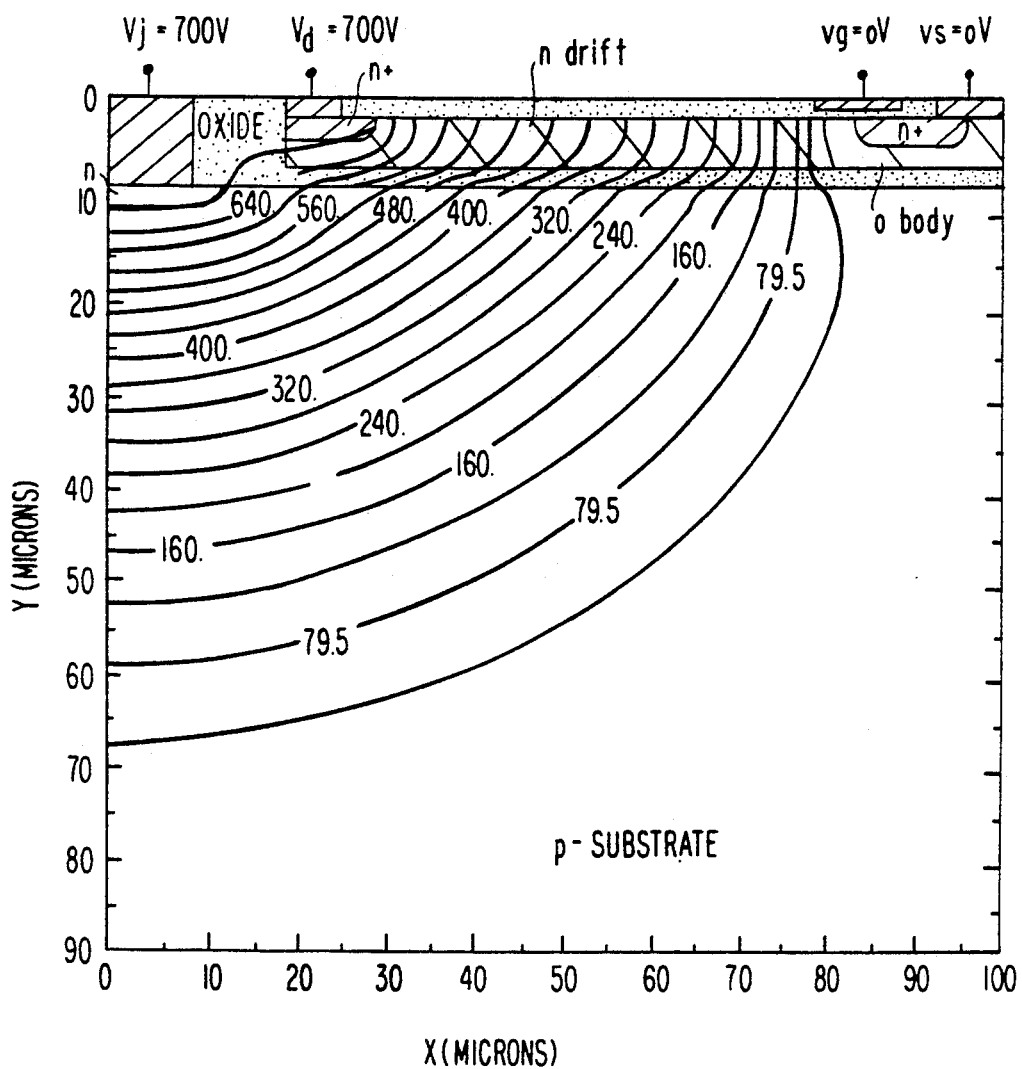
FIG. 4 is an equipotential contour map, produced by computer simulation, of the electrostatic potential distribution in the LDMOS transistor operating in a grounded source configuration, in the bridge circuit shown in FIG. 3.
Figure 5:
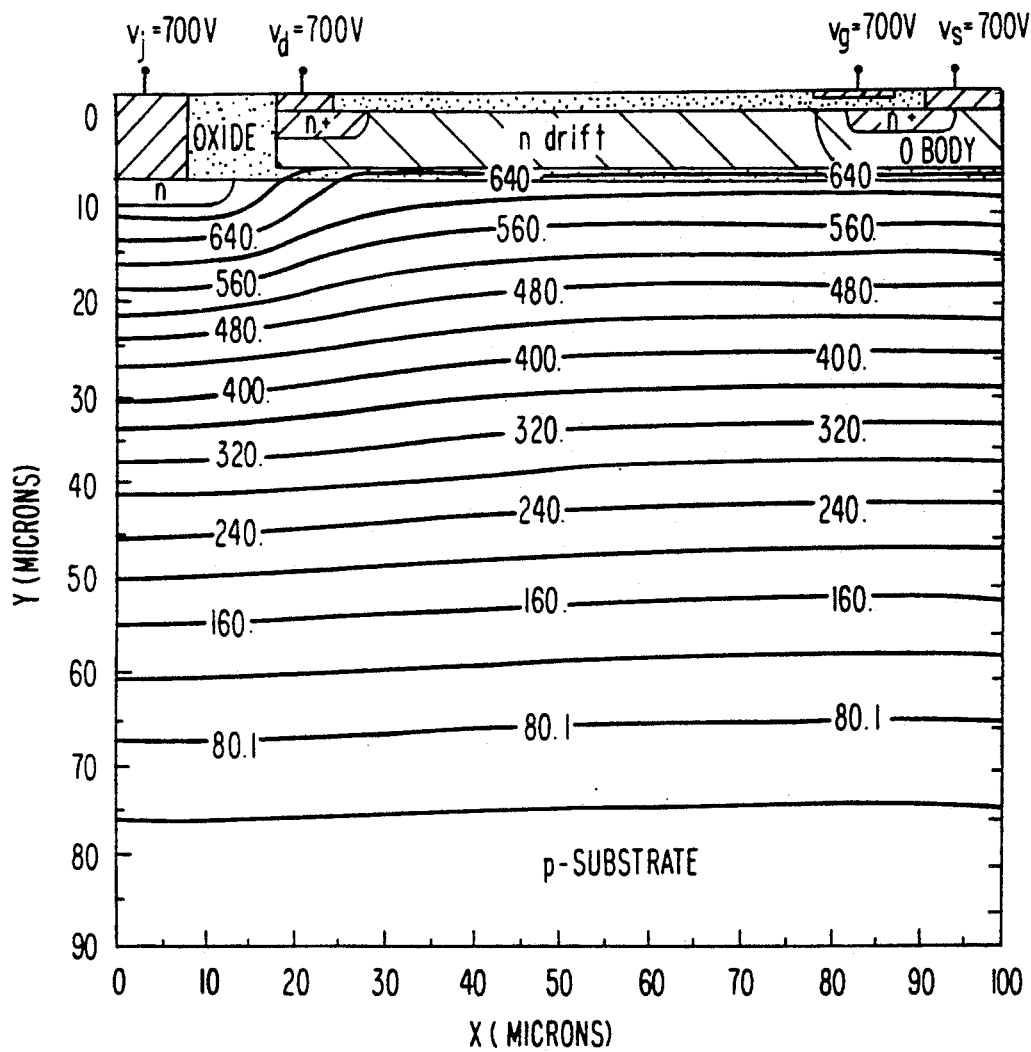
FIG. 5 is an equipotential contour map produced by computer simulation, of the electrostatic potential distribution in the LDMOS transistor operating in a source-follower configuration, in the bridge circuit shown in FIG. 3.

FIG. 4 and FIG. 5 are equi-potential contour maps formed by computer simulation of the devices constituting the bridge circuit represented in FIG. 3 in which the applied voltage to the drain of the source-follower transistor diffused area is 700 volts.

FIG. 4 shows the map for the device operating in the common-source configuration and FIG. 5 shows the map for the device operating in the source follower configuration. In both cases, the calculated breakdown voltage exceeds 700 volts and the potential contours are uniformly spaced indicating the electric field to be uniform as is required for the realization of maximum possible breakdown voltage.

While the instant example is directed to an LDMOS transistor, the method of the invention may readily be applied to high-voltage integrated circuits containing other dielectrically isolated devices such as diodes and insulated gate bipolar transistors. The isolation of the devices may be readily achieved by use of the isolation trenches a shown.

In general, the presence of only a single buried diffusion area is sufficient to provide an improvement in the voltage breakdown characteristics of the integrated circuit.

What is claimed is:

1. An integrated circuit device exhibiting improved voltage breakdown properties, comprising a semiconductor foundational substrate of a resistivity greater than about 100 ohm-cm of a first conductivity type, an insulating layer provided on said substrate, a semiconductor layer provided on said insulating layer, a plurality of laterally separated circuit elements forming parts of subcircuits provided in said semiconductor layer, a diffusion area of a second conductivity type, opposite to said first conductivity type, provided in said substrate, underlying none of said circuit elements and means for contacting and holding said diffusion area at a voltage at least equal to the highest potential of any subcircuit in said circuit device.

2. The integrated circuit device of claim 1, wherein said substrate is a p-type semiconductor substrate and said diffusion area is a n-type diffusion area.

3. The integrated circuit device of claim 2, wherein the substrate is a p-type silicon substrate and the insulating layer is silicon dioxide.

4. The integrated circuit device of claim 3 wherein the semiconducting layer is substantially n-type monocrystalline silicon layer.

5. The integrated circuit device of claim 3, wherein a single diffusion area is provided for a multiplicity of circuit components.

6. The integrated circuit device of claim 3 wherein the diffusion layer is held at a voltage higher than the highest potential of any subcircuit in said integrated circuit device and said diffusion area is provided with a separate potential source.

7. An integrated circuit device exhibiting improved voltage breakdown properties, particularly adapted for high voltage applications, comprising a relatively high resistivity semiconductor foundational substrate of a first conductivity type, an insulating layer provided on said substrate, a semiconductor layer of a second conductivity type opposite to said first conductivity type provided on said insulating layer, a plurality of circuit elements forming parts of subcircuits provided in said semiconductor layer, a diffusion area of said second conductivity type provided in said semiconductor layer, underlying none of said circuit elements, said diffusion area having no overlying circuit element, and means for holding said diffusion area at a voltage at least equal to the highest potential of any subcircuit in said circuit device.

8. The integrated circuit device of claim 7 wherein the substrate is a p-type semiconductor substrate, the semiconductor layer is an n-type semiconductor layer, and the diffusion area is an n-type diffusion area.

9. The integrated circuit device of claim 8 wherein the substrate is a p-type silicon substrate, the insulating layer is silicon dioxide and the semiconductor layer is substantially n-type monocrystalline silicon layer.

10. An integrated circuit device of claim 9 wherein the diffusion area is held at a voltage higher than the highest potential of any subcircuit in said integrated circuit device and said diffusion area provided with a separate potential source.

11. A semiconductor-on-insulator lateral MOS transistor source-follower bridge structure exhibiting improved voltage breakdown properties, particularly adapted for high voltage applications comprising a semiconductor foundational substrate of a first conductivity type, an insulating layer provided on said substrate, a semiconducting layer provided on said insulating layer, drain, gate, source and interconnect portions of said transistor provided in said semiconductor layer, a diffusion area of a second conductivity type, opposite to said first conductivity type, provided in said substrate, underlying none of said drain, gate and source portions and means for holding said diffusion area at a voltage at least equal to the highest potential of said drain and source portions.

12. The structure of claim 11 wherein said substrate is a p-type semiconductor substrate and said diffusion area is a n-type diffusion area.

13. The structure of claim 12 wherein the substrate is p-type silicon substrate and the insulating layer is silicon dioxide.

14. The structure of claim 13 wherein the semiconductor layer is substantially n-type monocrystalline silicon layer.

* * * * *